(12) United States Patent
Motowaki et al.

(10) Patent No.: US 7,520,742 B2
(45) Date of Patent: Apr. 21, 2009

(54) NANOPRINT EQUIPMENT AND METHOD OF MAKING FINE STRUCTURE

(75) Inventors: Shigehisa Motowaki, Hitachi (JP); Akihiro Miyauchi, Hitachi (JP); Masahiko Ogino, Hitachi (JP); Kosuke Kuwabara, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 320 days.

(21) Appl. No.: 10/801,579

(22) Filed: Mar. 17, 2004

(65) Prior Publication Data

US 2004/0182820 A1 Sep. 23, 2004

(30) Foreign Application Priority Data

Mar. 20, 2003 (JP) ............... 2003-077295

(51) Int. Cl.
*B29C 33/00* (2006.01)
*B29C 59/02* (2006.01)

(52) U.S. Cl. ............... 425/385; 106/38.27; 106/38.28; 249/114.1; 249/115; 977/887

(58) Field of Classification Search ............ 425/385; 977/887; 249/114.1, 115; 106/38.2, 38.28, 106/38.27

See application file for complete search history.

(56) References Cited

U.S. PATENT DOCUMENTS 4,668,460 A * 5/1987 Ongena ............... 264/255
5,073,588 A * 12/1991 Seltmann et al. ............ 524/264
6,069,740 A * 5/2000 Hamanaka ............... 359/620
6,171,091 B1 * 1/2001 Bettencourt ............... 425/116
6,309,580 B1 * 10/2001 Chou ............... 264/338
6,385,997 B1 * 5/2002 Nelson et al. ............... 65/64
6,719,915 B2 * 4/2004 Willson et al. ............... 216/44
6,855,286 B2 * 2/2005 Osawa et al. ............ 264/328.12
6,957,608 B1 * 10/2005 Hubert et al. ............... 101/483
2001/0012596 A1 * 8/2001 Kunimoto et al. ............ 430/138
2002/0064575 A1 * 5/2002 Miyakawa et al. ............ 425/470

FOREIGN PATENT DOCUMENTS

JP 5-80530 4/1993
JP 2002-270541 9/2002

OTHER PUBLICATIONS

Japanese Notice of the Rejection (Official Action) for Application No. 2003-077295, dated Oct. 30, 2007.

* cited by examiner

*Primary Examiner*—James Mackey
*Assistant Examiner*—Emmanuel S Luk
(74) *Attorney, Agent, or Firm*—Antonelli, Terry, Stout & Kraus, LLP.

(57) ABSTRACT

A pillar with a high aspect ratio is transferred by a nanoprinting method. In order to form a fine structure on a substrate, a nanoprinting apparatus heats and presses the substrate and a mold with a fine concave-convex pattern formed thereon, the mold having a mechanism for transferring and applying a mold-releasing agent. A method for transferring a fine structure using the aforementioned nanoprinting apparatus.

8 Claims, 14 Drawing Sheets

T>Tg

T<Tg

NANOPRINT EQUIPMENT AND METHOD OF MAKING FINE STRUCTURE

BACKGROUND OF THE INVENTION

1. Technical Field

The present invention relates to a nanoprint transfer method for forming a fine structure on a substrate using a mold comprising a heating and a pressure-applying mechanism.

2. Background Art

In recent years, the semiconductor integrated circuits are becoming increasingly finer and more integrated. To cope with such size reductions and increased levels of integration, the accuracy of photolithography equipment as a pattern transfer technology has been continuously improved. However, the processing method now involves a scale close to that of the wavelength of the photolithographic light source, and the lithography technology is close to its limit. As a result, in order to allow for further reductions in size and achieve higher accuracy, electron beam lithography equipment, which is a type of charged-particle beam equipment, has come to be used more often than photolithography technology.

When patterns are formed using an electron beam, a mask pattern is drawn, in contrast to the one-shot exposure method whereby an i-line or excimer laser light source is used for pattern formation. Accordingly, the electron beam pattern forming method takes more time for exposure (drawing) as the number of patterns to be drawn increases, disadvantageously resulting in increased time for pattern formation. As the level of integration greatly increases from 256 M to 1 G to 4 G, the time required for pattern formation also increases greatly, possibly resulting in significantly lowered throughput. Thus, in order to reduce time required by the electron beam lithography equipment, development of a one-shot pattern irradiation method is underway whereby masks of various shapes are combined and are irradiated with an electron beam in a single shot and electron beams of complex shapes are formed. While this allows ever finer patterns to be obtained, it also results in an increase in the size of the electron beam lithography equipment, and it requires a mechanism for controlling mask positions more accurately, thereby increasing equipment cost.

Technologies for carrying out fine pattern formation at low cost are disclosed in U.S. Pat. No. 5,259,926, U.S. Pat. No. 5,772,905 and S. Y. Chou et al., Appl. Phys. Lett., vol. 67, p. 3314 (1995), for example. According to these technologies, a mold having the same concave-convex pattern as that which is desired to be formed on a substrate is stamped onto a resist film layer formed on the surface of the substrate, thereby transferring the predetermined pattern onto the substrate. Particularly, it is described in U.S. Pat. No. 5,772,905 and S. Y. Chou et al., Appl. Phys. Lett., vol. 67, p. 3314 (1995) that the disclosed nanoimprint technique, using a silicon wafer as a mold, can transfer and form fine structures of not more than 25 nanometers.

JP Patent Publication (Kokai) No. 2002-283354 discloses a mold for an imprining process, the mold being capable of correct transfer of patterns by a press operation and being covered with perfluoropolyether having a functional group that chemically reacts with the material of the mold. The object of this prior art is the manufacture of an imprint-process mold having a good releasing property with respect to a polymeric resin and in which a mold-releasing agent does not exist in the concave grooves in the mold, without releasing toxic gases into the atmosphere. Specifically, the publication discloses a method of manufacturing the imprint-process mold comprising a first step of washing the surface of the imprint-process mold, and a second step of exposing the imprint-process mold to the aforementioned perfluoropolyether.

SUMMARY OF THE INVENTION

However, even with the imprint technique that is supposed to be capable of forming a fine pattern, it is difficult to release a mold from the substrate accurately once the mold has been pressed thereon, without deforming the fine concave-convex pattern formed on the substrate, such as pillars with high aspect ratios.

JP Patent Publication (Kokai) No. 2002-283354 discloses that a mold is released by dipping it into a solution of a mold-releasing agent. In this method, however, the mold-releasing agent is formed also in the concave portions of the mold such that pillars with high aspect ratios cannot be formed.

In view of the foregoing, it is the object of the present invention to provide a nanoprinting method, which is a technique for transferring a pattern for the formation of a finely shaped structure, whereby a pillar with a high aspect ratio can be transferred with high accuracy.

The invention is based on a technique whereby a mold-releasing agent is formed only at a convex portion of the mold.

In one aspect, the invention provides a nanoprinting apparatus for heating and pressing a substrate and a mold on which a fine concave-convex pattern is formed, in order to form a fine structure on said substrate. The apparatus further comprises a mechanism for forming a mold-releasing agent only on a convex portion of said mold. By thus forming the mold-releasing agent only at the convex portion of the mold, a mold-releasing layer is formed only at the convex portion of the mold and no such mold-releasing layer is formed at a concave portion of the mold. As a result, a pillar with a high aspect ratio can be formed.

Preferably, the mold-releasing agent is formed as a sheet.

In another aspect, the invention provides a pattern transfer method for heating and pressing a substrate and a mold together, on the surface of the mold a fine concave-convex pattern is formed, using a nanoprinting apparatus. The method allows a fine structure to be formed on said substrate, wherein a mold-releasing agent is transferred and applied to the mold.

A resin substrate or a resin film on a substrate is preferably molded by either: 1) heating and deforming the resin substrate or the resin film on the substrate; 2) pressing and molding the resin substrate or the resin film on the substrate and then optically curing the resin substrate or the resin film; or 3) optically curing the resin substrate or the resin film on the substrate.

In yet another aspect, the invention provides a mold for forming a fine structure on a substrate using a press machine, wherein a release treatment is provided only on a convex portion of the surface of said substrate.

BRIEF DESCRIPTION OF THE DRAWINGS

FIG. 2A shows an apparatus for forming a mold-releasing agent on a convex portion of the surface of a mold. FIG. 2B shows an apparatus for transferring a fine concave-convex pattern of the mold to a substrate.

DETAILED DESCRIPTION OF THE PREFERRED EMBODIMENTS

Figure 1A:
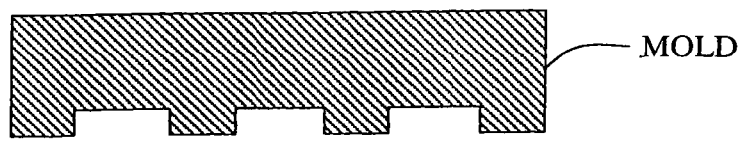
FIG. 1 schematically shows the individual steps of a nanoprinting process.
Figure 1B:
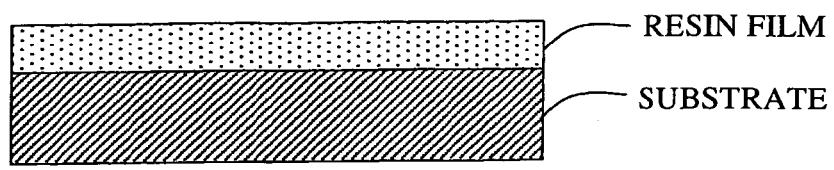
Figure 1C:
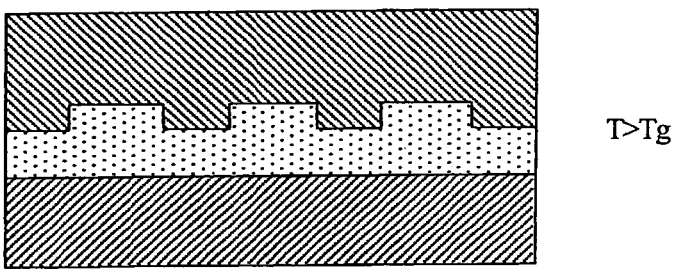
Figure 1D:
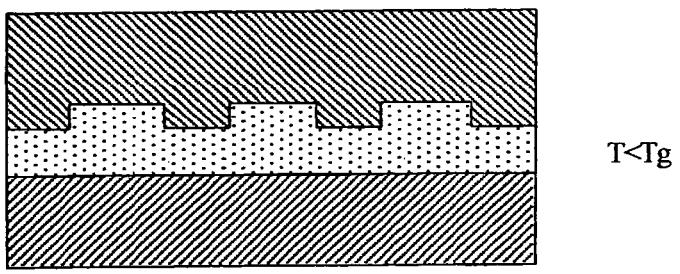

Referring to FIG. 1, the nanoprinting method will be described. A mold is produced by forming a fine pattern on the surface of a silicon substrate, for example. On another substrate, there is provided a resin film (FIG. 1(a)). Using a press machine, not shown, equipped with a heating and press mechanism, the mold is pressed on the resin film at temperatures exceeding the glass-transition temperature (Tg) of the resin and at a predetermined pressure (FIG. 1(b)). After cooling and hardening (FIG. 1(c)), the mold is released from the substrate, transferring the fine pattern of the mold onto the resin film on the substrate (Fig. 1(d)). Alternatively, instead of the heat-molding step, a photopolymerizing resin may be used which can be irradiated with light after molding and then cured. Further alternatively, a light-transmitting mold made of glass, for example, may be used, such that the resin can be irradiated with light shone from above the light-transmitting mold and then cured.

The nanoprinting method offers various merits. For example: 1) it can transfer extremely fine integrated patterns with high efficiency; 2) it can reduce equipment cost; and 3) it can be used for complex shapes and is capable of forming pillars.

Fields of application of the nanoprinting method are many, including: 1) various bio-devices such as DNA chips and immunoassay chips, particularly disposable DNA chips; 2) semiconductor multilayer wiring; 3) printed circuit boards and RF MEMS; 4) optical or magnetic storage; 5) optical devices, such as waveguides, diffraction gratings and polarizers, and photonic crystals,; 6) sheets; 7) LCD displays; and 8) FED displays. The present invention can be suitably applied to any of these fields.

The term "nanoprint" herein refers to the transfer of patterns or the like measuring several 100 μm to several nm.

As the press machine used in the present invention, it is preferable to employ a machine equipped with a heating and press mechanism and/or a mechanism for shining light from above the light-transmitting mold, from the viewpoint of efficient pattern transfer.

In the invention, the method of forming the fine pattern on the mold that is to be transferred is not particularly limited. For example, photolithography, electron beam lithography or other techniques may be employed, depending on the desired processing accuracy. The material for the mold may be any material as long as it has a desired strength and a required level of workability, such as silicon wafer, various metal materials, glass, ceramics and plastics. More specifically, examples include Si, SiC, SiN, polycrystalline Si, glass, Ni, Cr, Cu and combinations thereof.

The material for the substrate used in the present invention is not particularly limited, the only requirement being that it has a required strength. Examples include silicon, various metal materials, glass, ceramics and plastics.

The resin film onto which the fine structure is transferred in the invention is not particularly limited and may be selected from a variety of examples depending on the desired processing accuracy. The examples include thermoplastic resins such as polyethylene, polypropylene, polyvinyl alcohol, polyvinylidene chloride, polyethylene terephthalate, polyvinyl chloride, polystyrene, ABS resin, AS resin, acrylic resin, polyamide, polyacetal, polybutylene terephthalate, glass-reinforced polyethylene terephthalate, polycarbonate, denatured polyphenylene ether, polyphenylene sulfide, polyetheretherketone, liquid crystal polymer, fluororesin, polyarylate, polysulfone, polyethersulfone, polyamide-imide, polyetherimide and thermoplastic polyimide; and thermosetting resins such as phenol resin, melamine resin, urea resin, epoxy resin, unsaturated polyester resin, alkyd resin, silicone resin, diallyl phthalate resin, polyaminobismaleimide and poly-bis-amide-triazole; and materials in which two or more of the above-mentioned materials are blended.

EXAMPLES

Examples of the invention will be hereafter described.

Example 1

Figure 2:
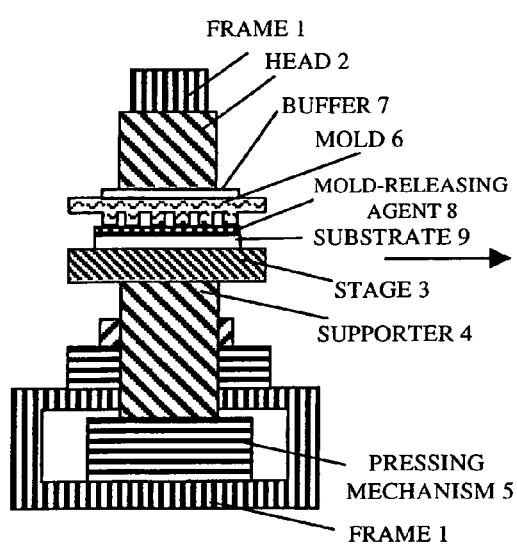
FIG. 2 shows nanoprinting apparatuses according to the invention.
Figure 2:
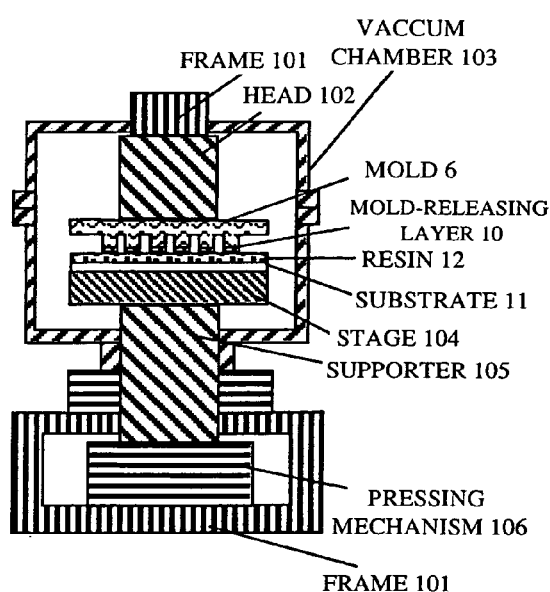
Figure 3:
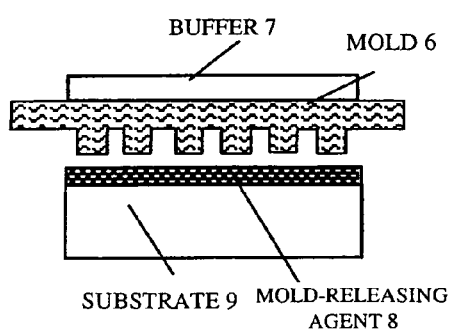
FIGS. 3A and 3B show enlarged views of FIGS. 2A and 2B, respectively, near the mold surface.
Figure 3:
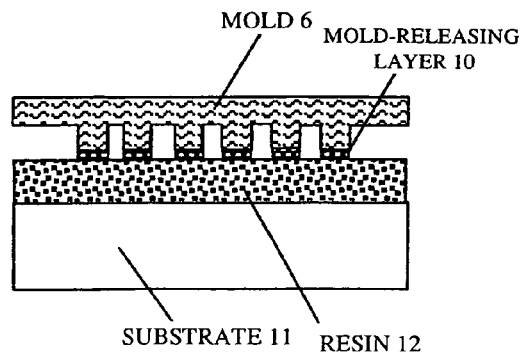

FIG. 2 shows nanoprinting apparatuses according to the invention. FIG. 2A shows an apparatus for forming a mold-releasing agent on the convex surface of a mold. FIG. 2B shows an apparatus for transferring a fine concave-convex pattern of the mold 6 to a substrate. FIGS. 3A and 3B are enlarged views of portions of FIGS. 2A and 2B, respectively, near the surface of the mold 6.

The process procedures will be described below. Referring to FIG. 3A, a silicone (polydimethyl siloxane) mold-releasing agent 8 was spin-coated, to a thickness of 200 nm, on a glass substrate 9 with a smooth surface. The substrate with the mold-releasing agent was then placed on a stage 3 as shown in FIG. 2A and secured with a vacuum chuck. A mold 6 (5-inch φ, with a thickness of 100 μm and a pattern depth of 500 nm) and a buffer 7 (4-inch φ, with a thickness of 3 mm) were further placed thereon. Using a press machine 5, the mold was pressed with a pressure of 2 MPa, thereby forming a mold-release agent layer on the mold 6. The buffer 7 was used for causing the mold to follow the contour of the substrate 9. By making the thickness of the mold-releasing agent smaller than the pattern depth of the mold 6, the mold-releasing layer can be formed only on the convex portions on the surface of the mold 6.

Then, a resin (polystyrene 679, manufactured by A & M Styrene Co., Ltd.) was spin-coated on a Si substrate 11 (5-inch φ, with a thickness of 0.5 mm) to a thickness of 600 nm, as shown in FIG. 3B. After the mold 6 on which the mold-releasing layer 10 had been formed was positioned and assembled with the substrate 11, the assembly was set on a stage 104, as shown in FIG. 2B. The fine-structure transfer apparatus of FIG. 2B differs from the mold-release agent forming apparatus of FIG. 2A in that it includes a vacuum chamber 103 and that the stage 104 is equipped with a heating mechanism.

Figure 4:
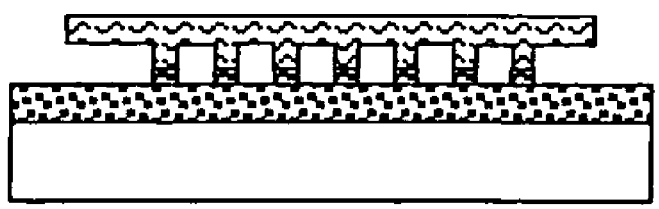
FIG. 4 shows the steps following the setting of a sample.
Figure 4:
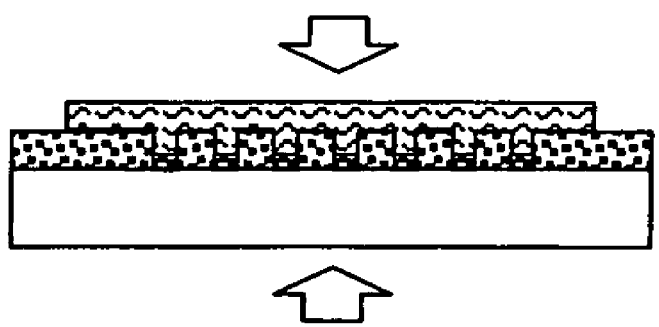
Figure 4:
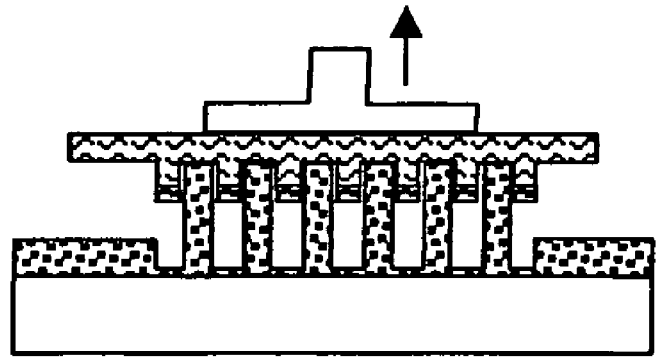
Figure 4:
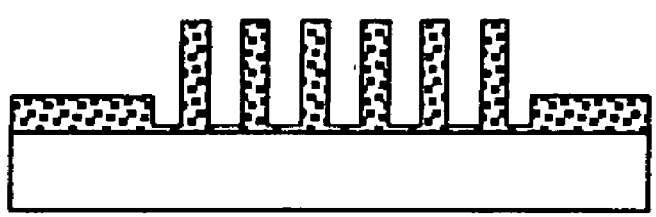
Figure 5:
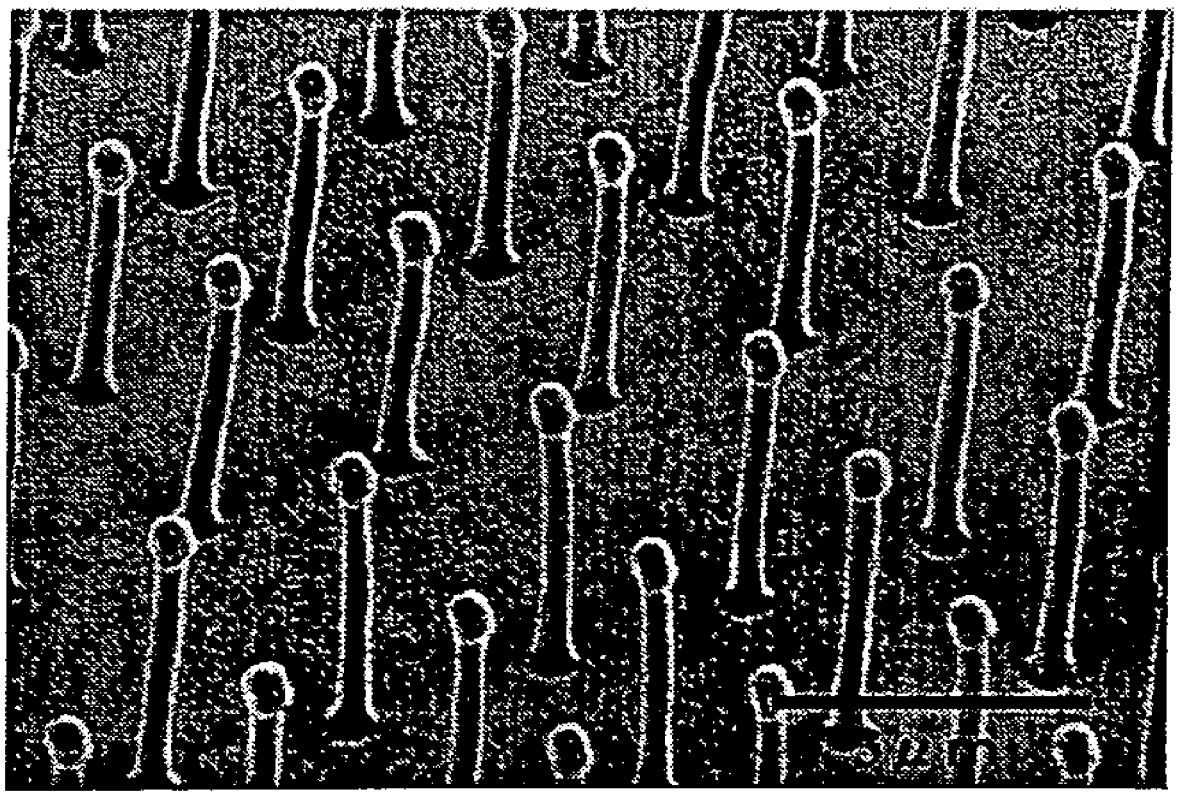
FIG. 5 shows a electron micrograph of polystyrene columnar structures.

Referring to FIG. 4, the steps following the placement of the sample will be described. In FIG. 4(a), the pattern of the mold 6 consisted of holes of 500-nm square and a depth of 1 μm. The pressure was reduced to 0.1 Torr or less and the mold was heated to 250° C., which was then pressed while maintaining the pressure at 12 MPa for ten minutes, as shown in FIG. 4(b). The mold was then allowed to stand in order for the temperature to cool down to 100° C., before the mold was exposed to the atmosphere. A release jig was bonded to the back surface of the mold at room temperature, and the mold was lifted vertically at the rate of 0.1 mm/s, whereby the resin filled in the mold holes was also lifted while being closely attached to the walls of the holes, as shown in FIG. 4(c). As a result, a columnar structure as shown in FIG. 4(d) was formed. Each columnar structure had a height three times as large as the depth of the mold, which clearly shows that the columnar structure was not the result of an exact transfer of the shape of the mold holes. If the mold-releasing agent is formed even at the concave portions of the mold, the resin would come off so smoothly during the release step that the concave-convex pattern of the mold would often be transferred exactly as is. Therefore, if the columnar structure of a desired shape is to be obtained with high reproducibility, the mold-releasing agent should be applied only to the convex portions of the mold. FIG. 5 shows an electron micrograph of the polystyrene columnar structure that was formed.

Example 2

Figure 6:
FIG. 6 illustrates a method of forming a DLC film only at convex portions of the surface of a mold.
Figure 6:
Figure 6:
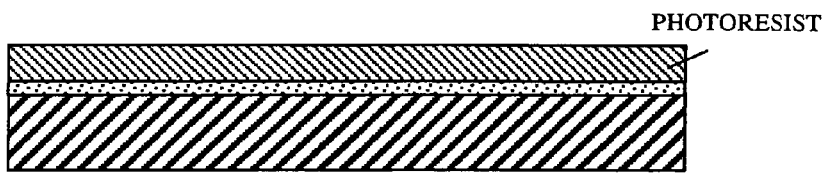
Figure 6:
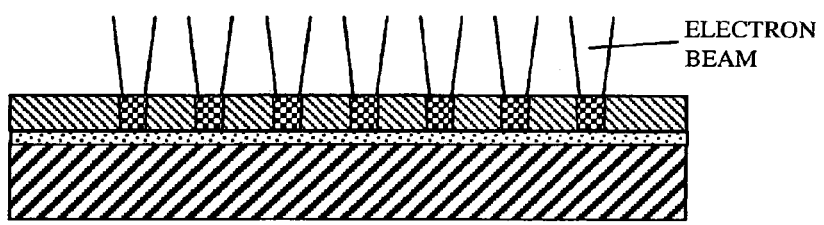
Figure 6:
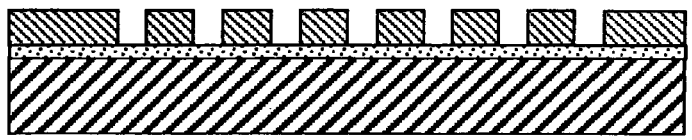
Figure 6:
Figure 6:
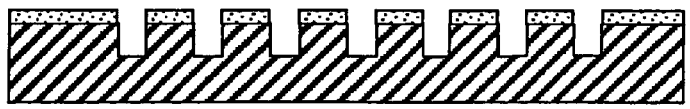

Another example will be described in which a DLC (diamond-like carbon) film was used as the mold-releasing agent. First, a method of forming the DLC film only on the convex portions on the surface of the mold will be described by referring to FIG. 6. A Si substrate of 5-inch φ and a thickness of 0.5 mm was prepared, as shown in FIG. 6(a). Then, the DLC film was formed on the substrate to a thickness of 50 nm by a plasma CVD method using methane as a carbon source, as shown in FIG. 6(b). A photoresist (OEBR1000, manufactured by Tokyo Ohka Kogyo Co., Ltd.) for electron beam exposure was then applied using a spin coater, as shown in FIG. 6(c). Thereafter, the resist was exposed by having a pattern directly drawn thereon by an electron beam using a JBX6000FS electron beam lithography apparatus (manufactured by Nippon Denshi), as shown in FIG. 6(d). The resin was then developed to obtain a concave-convex pattern as shown in FIG. 6(e). The resist was left in such a manner that circular patterns, each measuring 100 nm in diameter, were arranged in a matrix at a 150-nm pitch. If the patterns are on the order of several 100 nm or more, a Kr laser (with a wavelength of 351 nm) may be used instead of the electron beam. Using the concave-convex pattern of FIG. 6(e) as a mask pattern, the DLC film and the Si substrate were dry-etched to form a concave-convex pattern as shown in FIG. 6(f). The resist was thereafter removed by $O_2$ ashing, thereby obtaining a Si mold on which the DLC film was formed on the convex portions on the surface thereof, as shown in FIG. 6(g). Using this mold, a fine concave-convex pattern was transferred in the same manner as in Example 1. As a result, it was confirmed that a polystyrene columnar structure that is higher than the depth of the mold can be formed also in the case where the DLC film, as the mold-releasing agent, was formed on the convex surface. The DLC film is preferable as the mold-releasing agent, because it is hard, durable, can withstand the pressing process more than once and has a low friction.

Example 3

Figure 7:
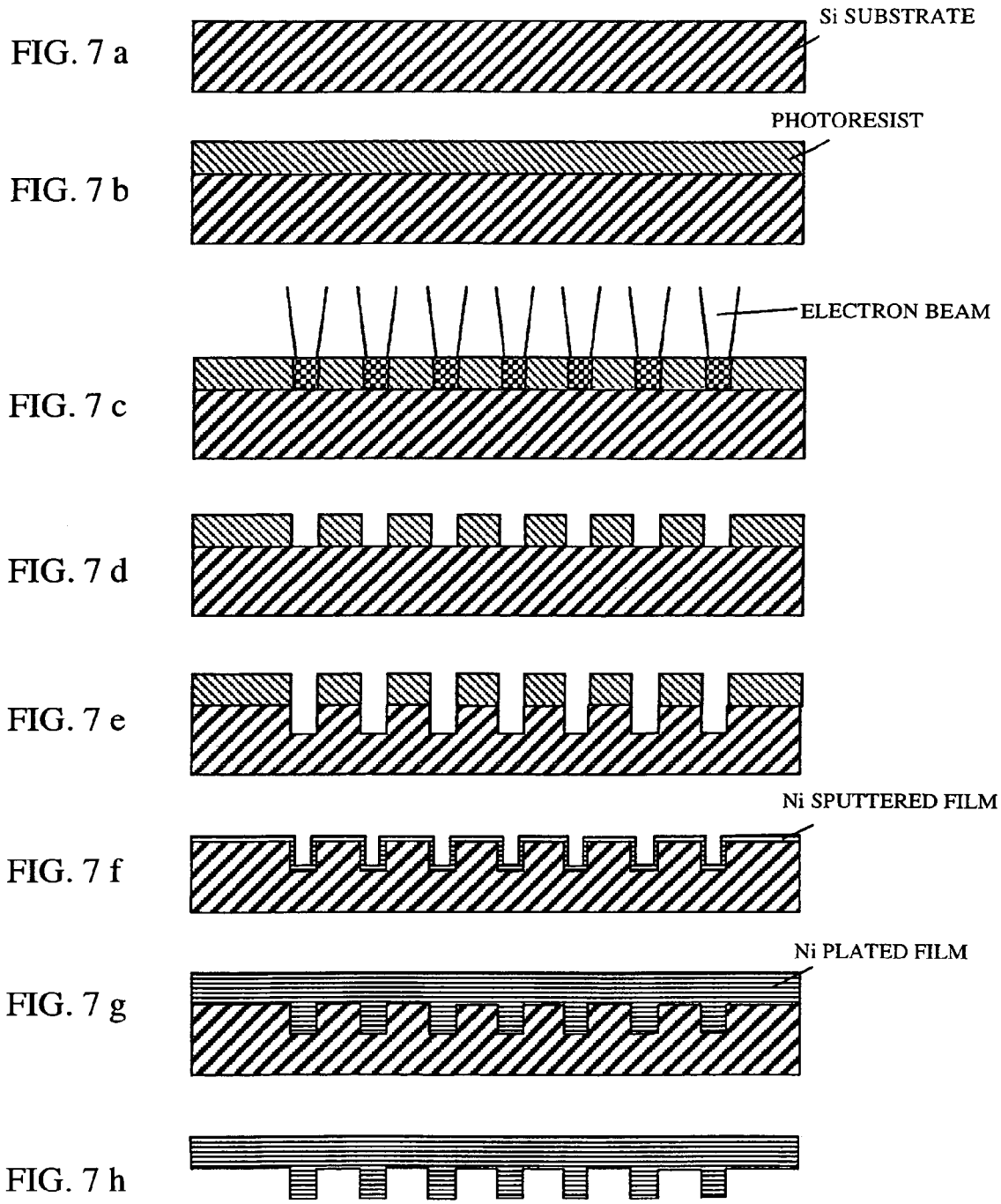
FIG. 7 illustrates a method of preparing an Ni mold.

Another example of the invention in which a roller-type mold-releasing agent forming apparatus and a roller-type nanoprinting apparatus are used will be described. In this example, a Ni flexible mold was employed. The method of preparing the Ni mold will be described by referring to FIG. 7, which is a conceptual diagram where the patterns are simplified and enlarged. First, a Si substrate of 5-inch φ and a thickness of 0.5 mm was prepared, as shown in FIG. 7(a). Then, a photoresist (OEBR1000, manufactured by Tokyo Ohka Kogyo Co., Ltd.) for electron beam exposure was then applied using a spin coater, as shown in FIG. 7(b). Thereafter, the resist was exposed by having a pattern directly drawn thereon by an electron beam using an electron beam lithography apparatus JBX6000FS (manufactured by Nippon Denshi), as shown in FIG. 7(c). The resin was then developed to obtain a concave-convex pattern as shown in FIG. 7(d). The resist was left in such a manner that circular patterns, each measuring 100 nm in diameter, were arranged in a matrix at a 150-nm pitch. If the patterns measure several 100 nm or more, a Kr laser (with a wavelength of 351 nm) may be used instead of the electron beam. Using the concave-convex pattern of FIG. 7(d) as a mask pattern, the Si substrate was dry-etched to form a concave-convex pattern as shown in FIG. 7(e). The resist was thereafter removed by an $O_2$ ashing, thereby obtaining a silicon master disc on which columnar projections, each measuring 100 nm in diameter, were formed on the entire surface thereof. Ni was then deposited on the silicon master disc by sputtering, to a thickness of several 10 nm, as shown in FIG. 7(f), and Ni was additionally deposited by electroplating to a thickness of 100 μm, as shown in FIG. 7(g). The steps of FIG. 7(f) and (g) may be performed by electroless plating. Then, by finally releasing the Si master disc, a Ni mold was obtained in which holes, each measuring 100 nm in diameter, were formed in a matrix. This thinly formed Ni mold was flexible.

Figure 8:
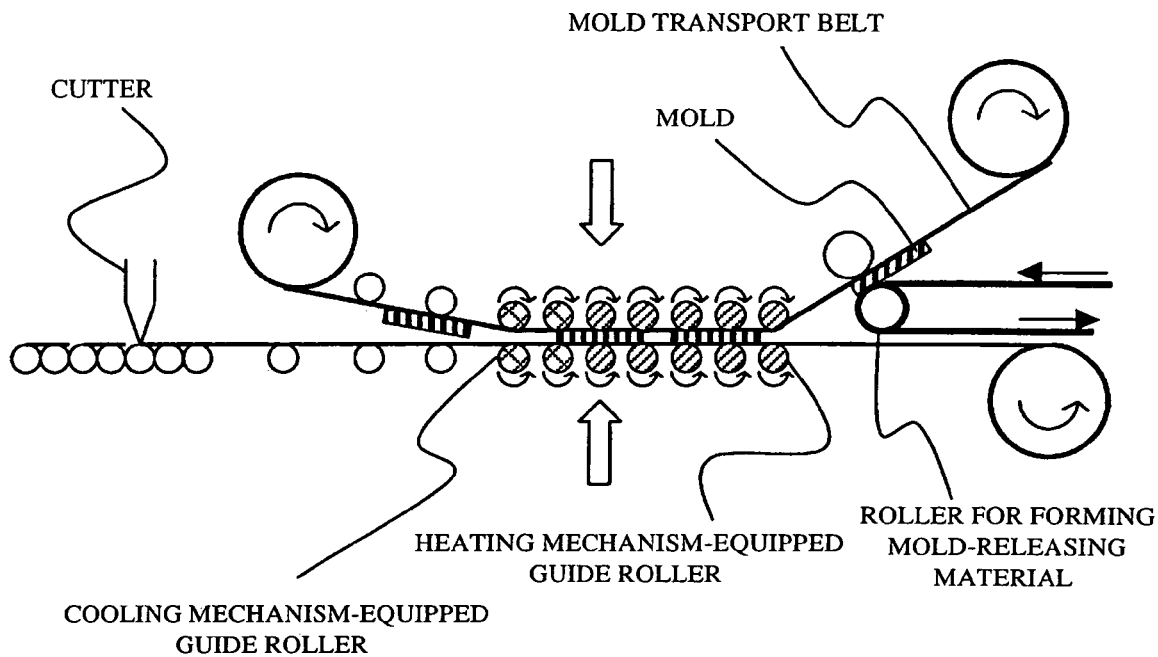
FIG. 8 shows a roller-type nanoprinting apparatus.
Figure 9:
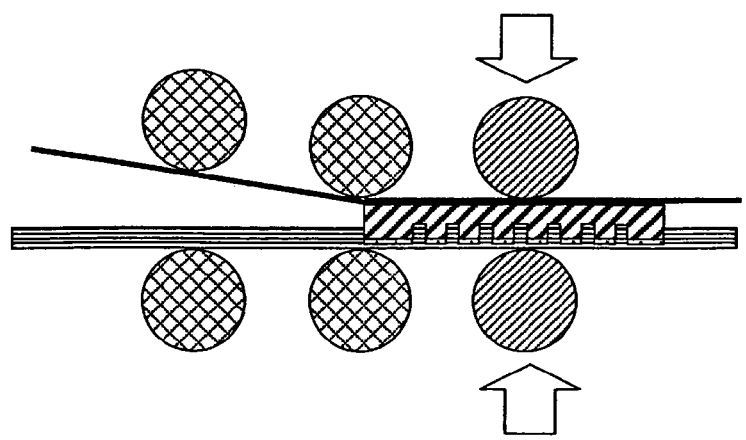
FIG. 9 shows an enlarged view of a press portion.

Using this Ni mold and the roller-type nanoprinting apparatus shown in FIG. 8, a printing process was carried out. The mold was secured to a mold transport belt and was transported from left to right in the figure. Before placing the mold on the transferred substrate, fluorine polymer was coated on the convex portions on the surface of the mold using a mold-releasing agent roller. On the other hand, the substrate to which a pattern is to be transferred was formed from PMMA (polymethyl methacrylate) in the shape of a sheet measuring 150 mm in width and 1 mm in thickness. The sheet was also transported by a guide roller towards the right. The guide roller, which was equipped with a heating mechanism, had its press portion set at 250° C., with preliminary heating temperatures of 50° C., 100° C., 150° C. and 200° C. provided from right to left. After the Ni mold and the PMMA substrate were pressed together, they were preliminarily heated and then pressed at 250° C. The pressure was set at 12 MPa. After the transfer of pattern was completed by the press portion, the mold and the PMMA substrate were cooled by a guide roller equipped with a cooling mechanism for temperatures 90° C. and 20° C. in a step-wise manner. The transport speed was set at 1 mm/sec. FIG. 9 shows an enlarged view of the press portion. Following the press operation, the mold was lifted by the transport belt at a shallow angle (5°) while being cooled. The mold was thus lifted substantially vertically, as shown in FIG. 4(c), thereby forming a columnar structure. As described above, the columnar structure can also be formed by the application of a mold-releasing agent onto the convex surface using the roller-type nanoprinting apparatus.

Examples of the Application of the Invention

Hereafter, several fields to which the nanoprinting technique using the mold with a release-mechanism according to the invention can be suitably applied will be described.

Example 4

(Bio Immuno) Chip

Figure 10:
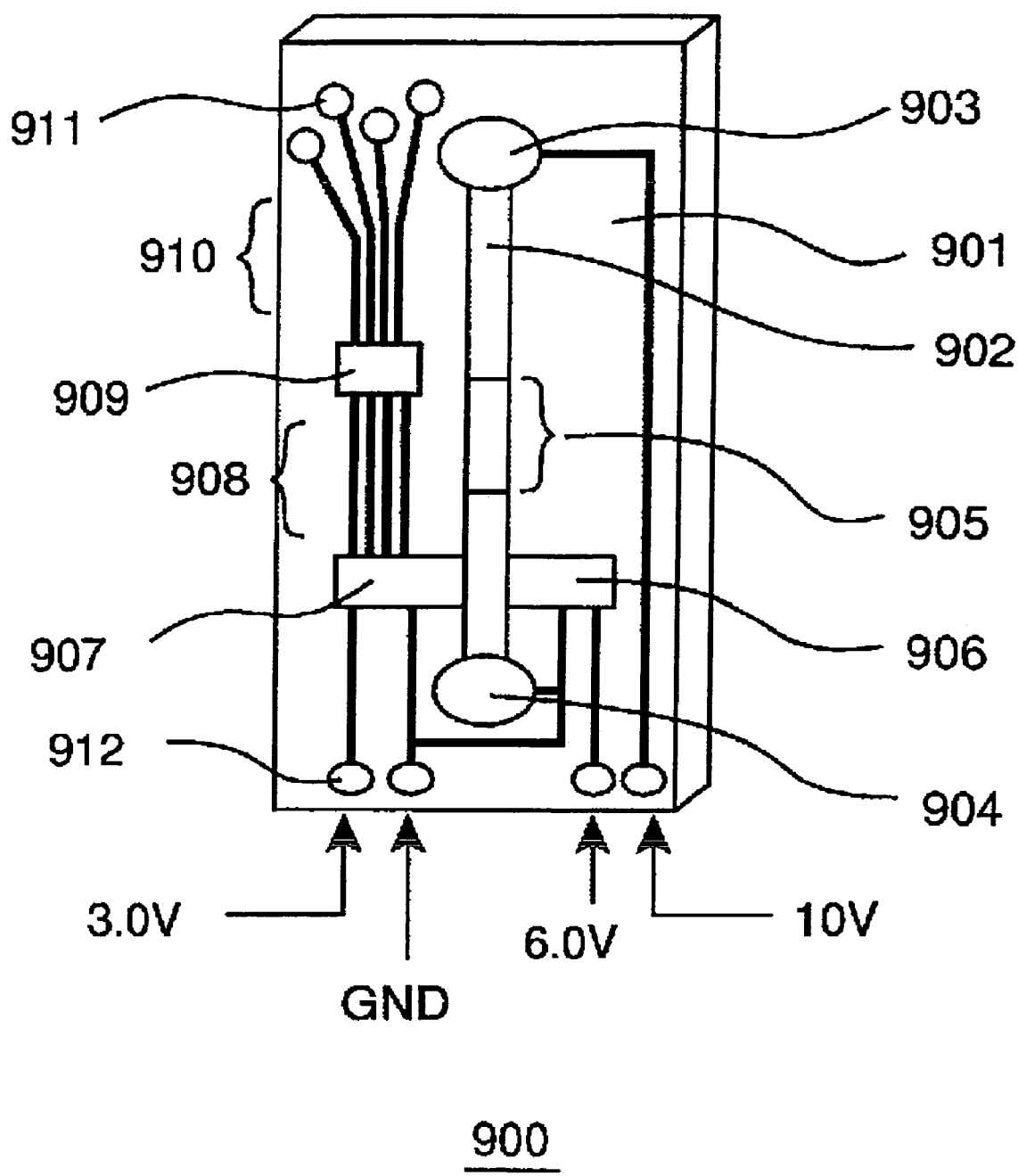
FIG. 10 schematically shows a biochip.

FIG. 10 schematically shows a biochip 900. In a substrate 901 made of glass, a passage 902 is formed with a depth of 3 μm and a width of 20 μm. A specimen containing DNA (deoxyribonucleic acid), blood, protein and the like is introduced via an inlet 903 and is caused to flow in the passage 902 until it reaches an outlet 904. A molecular filter 905 is disposed in the passage 902. In the molecular filter 905, there is formed a projection assembly 100 measuring 250 to 300 nm in diameter and 3 μm in height.

Figure 11:
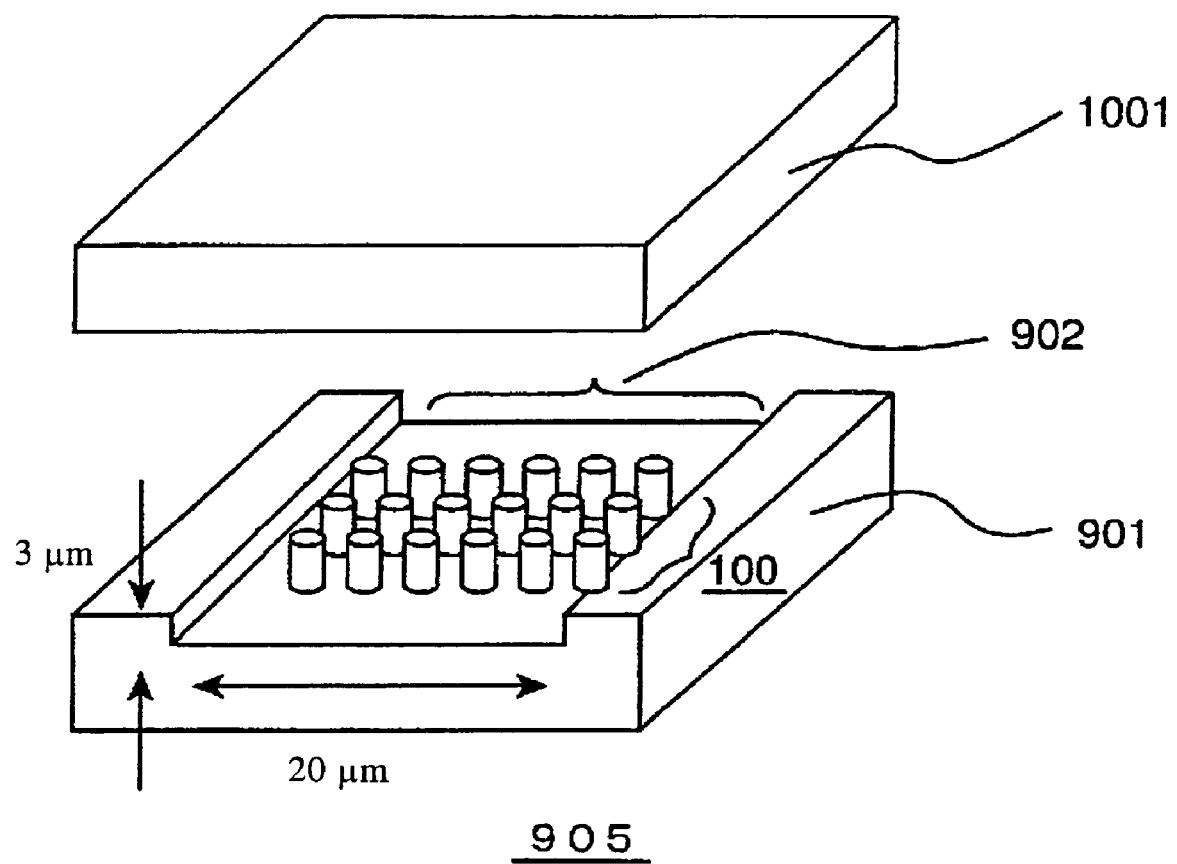
FIG. 11 is a cross-sectional perspective view of the biochip near where a molecular filter is formed.

FIG. 11 is a perspective view of the biochip 905 near where the molecular filter 905 is formed. The projection assembly 100 is formed in a part of the passage 902 formed on the substrate 901. The substrate 901 is covered with an upper substrate 1001 so that the specimen flows inside the passage 902. In the case of a DNA chain-length analysis, while a specimen containing DNA is electrophoresed in the passage 902, DNA is separated with high resolution by the molecular filter 905 depending on the length of the DNA chain. The specimen that has passed through the molecular filter 905 is irradiated with a laser light emitted by a semiconductor laser 906 mounted on the surface of the substrate 901. When the DNA passes, the light incident on a photodetector 907 is reduced by about 4%, so that the length of DNA chain in the specimen can be analyzed based on an output signal from the photodetector 907. The signal detected in the photodetector 907 is fed to a signal-processing chip 909 via a signal line 908. To the signal processing chip 909 is connected another signal line 910 which is also connected to an output pad 911 for connection with an external terminal. Power is supplied to individual components via a power supply pad 912 provided on the surface of the substrate 901.

Figure 12:
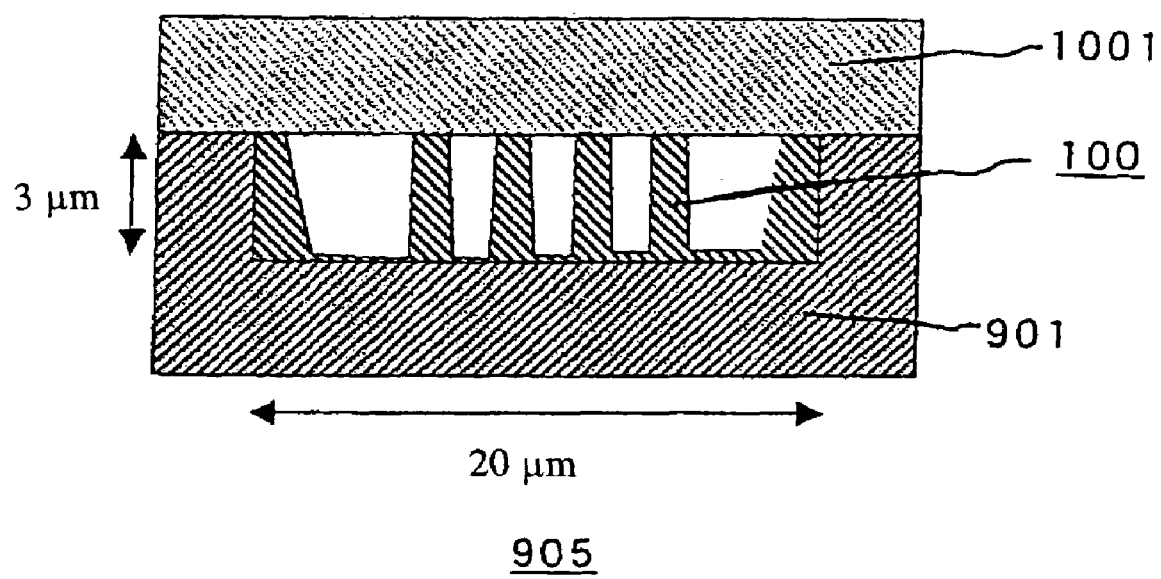
FIG. 12 is a cross-sectional view of a molecular filter.

FIG. 12 shows a cross section of the molecular filter 905 which, according to the present embodiment, comprises a substrate 901 with a concave portion, a plurality of projections formed on the concave portion of the substrate 901, and an upper substrate 1001 formed to cover the concave portion. The projections are formed such that their tips are in contact with the upper substrate. The projection assembly 100 is mainly made of an organic material and can therefore be deformed. Thus, the projection assembly 100 is not subject to damage when the upper substrate 1001 is mounted over the passage 902. The upper substrate 1001, therefore, can be placed in contact with the projection assembly 100. In this arrangement, highly sensitive analysis can be performed without the specimen leaking via the gap between the projections and the upper substrate 1001. When a chain-length analysis of DNA was actually conducted, it was learned that while the half-value width of resolution of the base pairs was 10 base pairs in the case of the projection assembly made of glass, it was possible to improved the half-value width of resolution of the base pairs to 3 base pairs in the case of the projection assembly made of an organic material. While the molecular filter in the present embodiment has a structure such that the projections come into contact with the upper substrate, a film made of the same material as that of the projections may be formed on the upper substrate such that the projections would instead come into contact with the film. In this way, better contact can be obtained.

While in the present embodiment there is only one passage 902, a plurality of passages 902 in which projections of different sizes are disposed may be provided. In this way, different kinds of analysis can be performed simultaneously.

While in the present embodiment DNA was examined as specimen, a particular sugar chain, protein or antigen may be analyzed by modifying the surface of the projection assembly 100 in advance with a molecule that reacts with the sugar chain, protein or antigen. By thus modifying the surface of the projections with an antibody, improvements can be made in the sensitivity of immunoassay.

By applying the invention to a biochip, projections for the analysis of organic materials with nanoscale diameters can be easily formed. Further, by controlling the shapes of the concave and convex portions on the mold surface or the viscosity of the organic material thin film, the position, diameter and/or height of the projections made of organic material can be controlled. Thus, in accordance with the invention, there can be provided a microchip for high-sensitivity analysis.

Example 5

Multilayer Wiring Board

Figure 13:
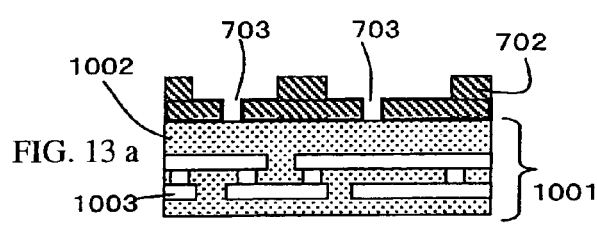
FIG. 13 shows the individual steps of a process of preparing a multilayer wiring board.
Figure 13:
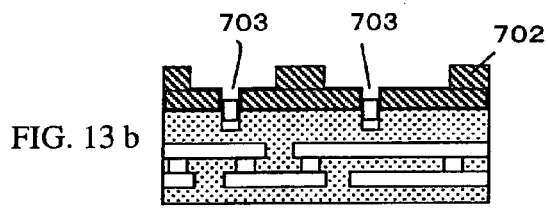
Figure 13:
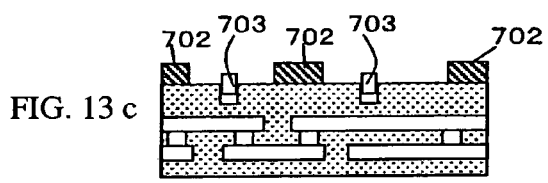
Figure 13:
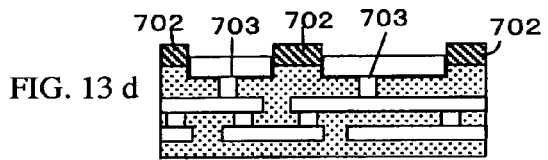
Figure 13:
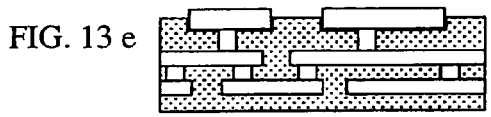
Figure 13:
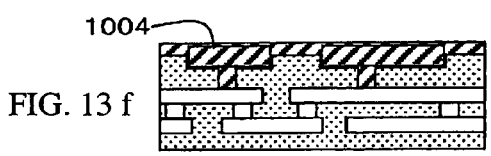
Figure 13:
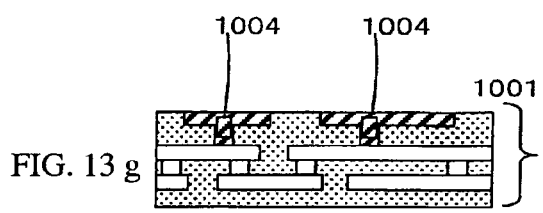
Figure 13:
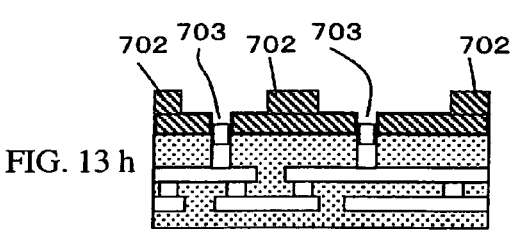
Figure 13:
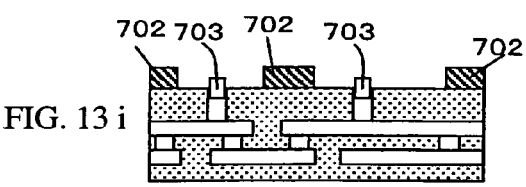
Figure 13:
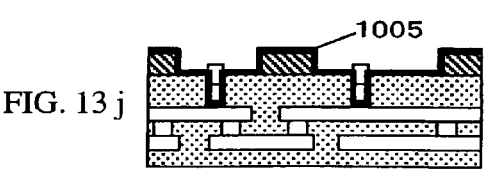
Figure 13:
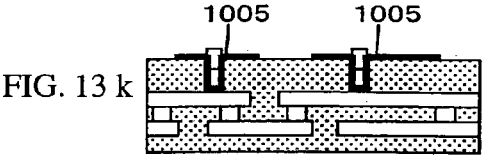
Figure 13:
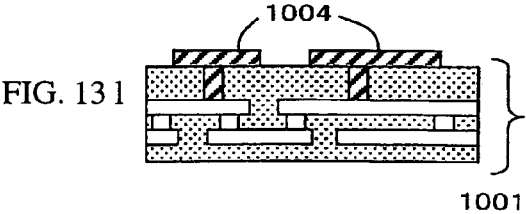

FIG. 13 shows the process of making a multilayer wiring board. After a resist 702 is formed on the surface of a multilayer wiring board 1001 comprising a silicon oxide film 1002 and copper wiring 1003, as shown in FIG. 13(a), a pattern transfer process is carried out using a mold (not shown). Exposed regions 703 on the multilayer wiring board 1001 are then dry-etched using $CF_4/H_2$ gas. As a result, the exposed regions 703 on the surface of the multilayer wiring board 1001 are processed in the shape of grooves, as shown in FIG. 13(b). The resist 702 is then resist-etched by RIE to thereby remove the resist at the lower-step portions, so that the exposed regions 703 are enlarged, as shown in FIG. 13(c). Thereafter, the exposed regions 703 are dry-etched until the previously formed grooves reach the copper wiring 1003, thereby obtaining a structure as shown in FIG. 13(d). The resist 702 is then removed to obtain the multilayer wiring board 1001 having a grooved surface, as shown in FIG. 13(e). On the surface of the multilayer wiring board 1001, a metal film is then formed by sputtering (not shown), followed by electroplating, thereby forming a metal-plated film 1004 as shown in FIG. 13(f). The metal-plated film 1004 is then polished until the silicon oxide film 1002 on the multilayer wiring board 1001 is exposed, thus obtaining the multilayer wiring board 1001 with metal wiring formed on the surface thereof, as shown in FIG. 13(g).

Another process for making a multilayer wiring board will be hereafter described. Upon dry-etching of the exposed regions 703 in the state shown in FIG. 13(a), by etching until the copper wiring 1003 inside the multilayer wiring board 1001 is reached, the structure shown in FIG. 13(h) is obtained. The resist 702 is then etched by RIE to remove the resist on the lower-step portions, thereby obtaining the structure shown in FIG. 13(i). Thereafter, a metal film 1005 is formed on the surface of the multilayer wiring board 1001 by sputtering, so that the structure shown in FIG. 13(j) is obtained. The resist 702 is then lifted and removed, thereby obtaining the structure shown in FIG. 13(k). By conducting an electroless plating using the remaining metal film 1005, the multilayer wiring board 1001 can be obtained with the structure shown in FIG. 13(*l*).

By applying the invention to a multilayer wiring board, wires can be formed with high dimensional accuracy.

Example 6

Magnetic Disc

Figure 14:
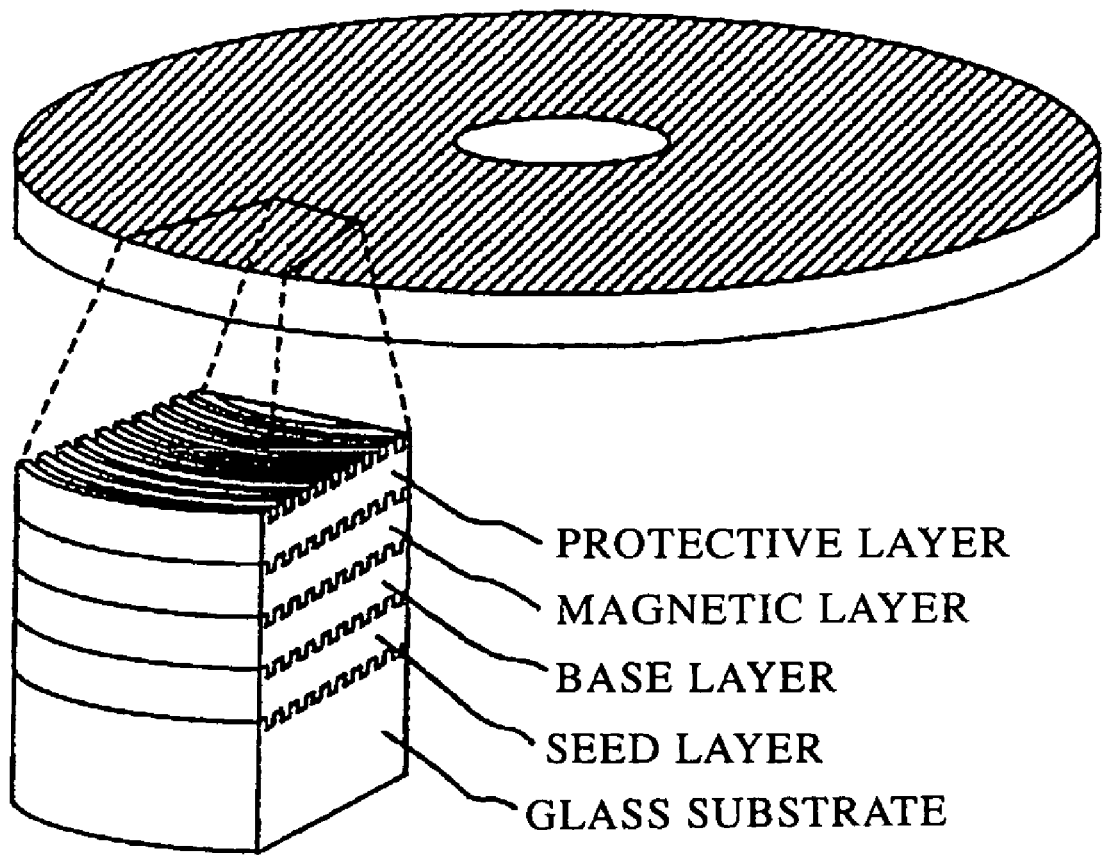
FIG. 14 is an overall view of a magnetic recording medium with an enlarged cross section thereof.
Figure 15:
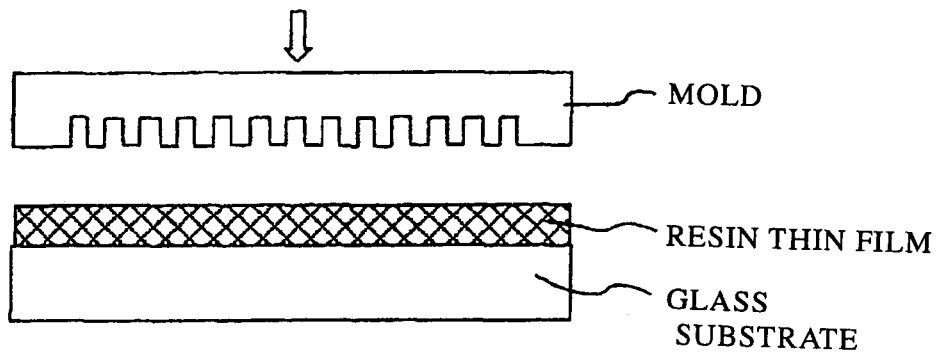
FIG. 15 illustrates a method of forming a concave-convex pattern on glass by a nanoprinting method, showing cross-sectional views of the glass taken along the radius thereof.
Figure 15:
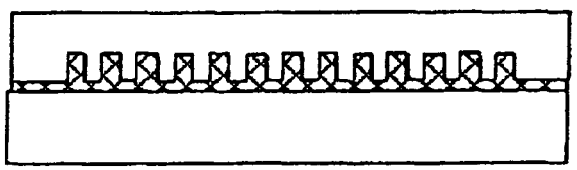
Figure 15:
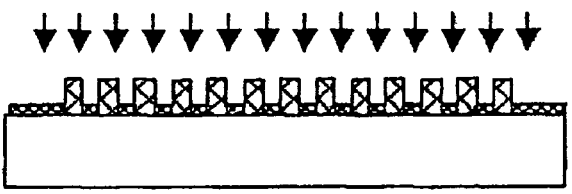
Figure 15:
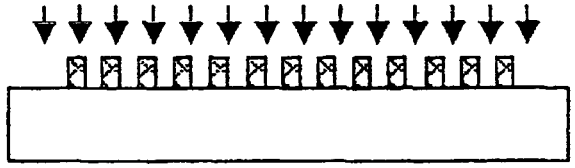
Figure 15:
Figure 15:
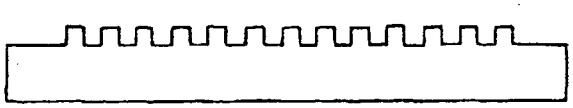

FIG. 14 shows an overall view of a magnetic recording medium according to Example 18, with a portion enlarged and shown in cross section. The substrate is made of glass having fine concave and convex portions. On the substrate are formed a seed layer, a base layer, a magnetic layer, and a protective layer. Now referring to FIG. 15, the method of manufacturing a magnetic recording medium according to the present example will be described. FIG. 15 shows a radial cross section of the substrate, illustrating a method of forming concave and convex portions on the glass by a nanoprinting method. First, a glass substrate is prepared. A soda lime glass was used in the present example. The material of the substrate is not particularly limited, with the only requirement being that it can be formed as a sheet. Examples include other glass materials such as aluminosilicate glass, and metal materials such as Al. Then, a resin film was formed to a thickness of 200 nm using a spin coater, as shown in FIG. 15(*a*). The resin was PMMA (polymethyl methacrylate).

For the mold, a Si wafer was prepared in which grooves were formed concentrically with the opening at the center of the magnetic recording medium. The grooves measured 88 nm in width and 200 nm in depth, and the pitch between the grooves was 110 nm. The convex and concave portions of the mold, which were very fine, were formed by photolithography using an electron beam. After heating the mold to 250° C. to reduce the viscosity of the resin, as shown in FIG. 15(*b*), the mold was pressed. When the mold was released at temperature below the glass-transition point of glass, a concave-convex pattern opposite to the pattern on the mold was obtained, as shown in FIG. 15(*c*). Thus, using the nanoprinting method, a pattern can be formed that is finer than visible light wavelength and beyond the dimensional limit of exposure by the conventional photolithography. Further, by removing the remaining film at the bottom of the resin pattern by dry etching, a pattern as shown in FIG. 15(*d*) can be formed. By further etching the substrate with hydrofluoric acid using this resin film as a mask, the substrate can be processed as shown in FIG. 15(*e*). By removing the resin with a remover, grooves with a width of 110 nm and a depth of 150 nm were formed, as shown in FIG. 15(*f*). Thereafter, a seed layer made of NiP was formed on the glass substrate by electroless plating. In the conventional magnetic discs, the NiP layer is formed to a thickness of 10 µm or more. In the present embodiment, the thickness of the NiP layer was limited to 100 nm in order to reflect the fine concave and convex shapes formed on the glass substrate onto the upper layer. Further, a Cr base layer of 15 nm, a CoCrPt magnetic layer of 14 nm, and a C protective layer of 10 nm were successively formed by a sputtering method generally employed in forming magnetic recording media, thereby preparing the magnetic recording medium according to the present embodiment. In this magnetic recording medium, the magnetic substance was radially isolated by the non-magnetic layer wall with a width of 88 nm. Thus, a higher longitudinal magnetic anisotropy was obtained. While the formation of concentric patterns using a polishing tape (texturing) is known in the art, it can only offer a pattern pitch on the order of microns and is therefore not suitable for high-density recording media. In the magnetic recording medium of the present embodiment, on the other hand, the magnetic anisotropy was ensured by forming the fine pattern by the nanoprinting method, and a high-density recording of 400 GB per square inch was achieved. The nanoprinting pattern formation technique is not limited to the circumferential direction, but it can also be used to form non-magnetic isolating wall in the radial direction. Further, the effect of the present embodiment whereby the magnetic anisotropy is provided is not particularly limited by the materials used in the seed layer, base layer, magnetic layer or protective layer.

Example 7

Optical Waveguide

Another example will be described in which an optical device with varying directions of propagation of incident light is applied to an optical information processing apparatus.

Figure 16:
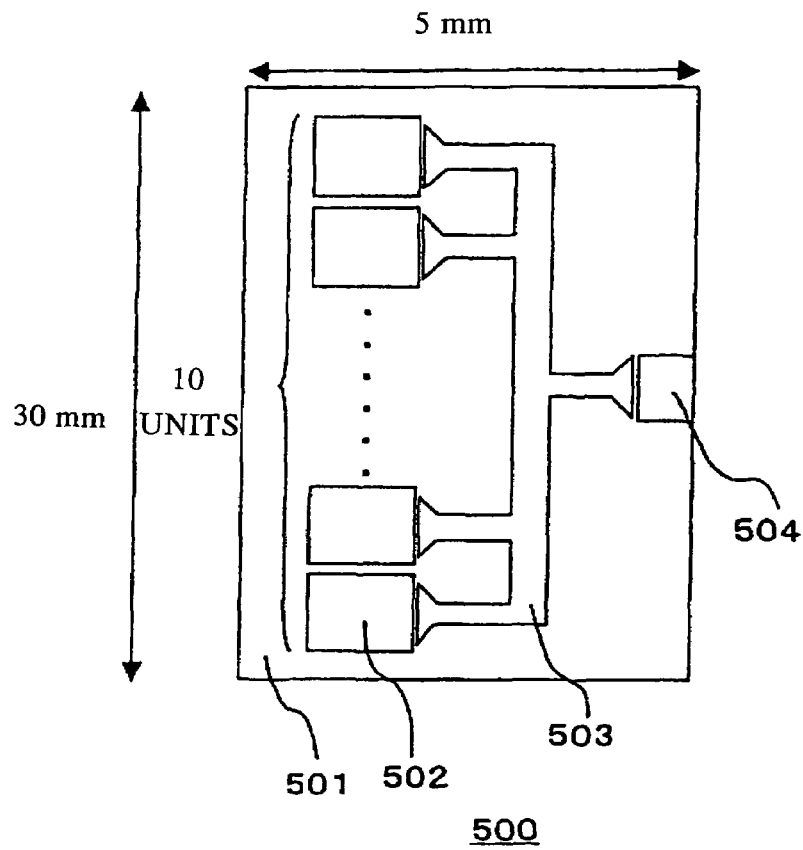
FIG. 16 schematically shows an optical circuit 500.

FIG. 16 schematically shows the structure of an optical circuit 500. The optical circuit 500 comprised a substrate 501 of aluminum nitride, measuring 30 mm in length, 5 mm in width and 1 mm in thickness. On the substrate 501 ten transmission units 502 were formed, each consisting of an InP semiconductor laser and a driver circuit, an optical waveguide 503 and an optical connector 504. The ten semiconductor lasers have different transmission wavelengths varying at 50 nm intervals. The optical circuit 500 is a basic component in optical multiplex communication system devices.

Figure 17:
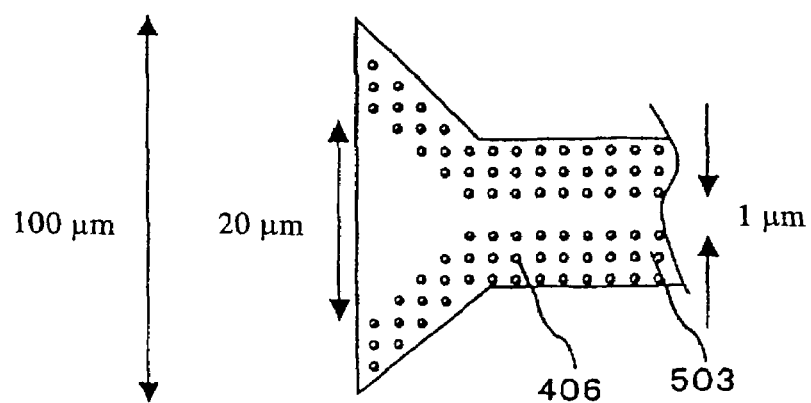
FIG. 17 schematically shows the layout of projections inside an optical waveguide.

FIG. 17 schematically shows the layout of projections 406 inside the optical waveguide 503. In order to allow for an alignment error between the transmission unit 502 and the optical waveguide 503, the optical waveguide 503 was formed to be wider toward the end that had a width of 20 µm. Thus, the waveguide had a structure such that a signal light was guided into a region with a width of 1 µm by a photonic bandgap. While the projections 406 were arranged at 0.5 µm intervals in the actual device, the projections 406 in FIG. 17 are shown in a simplified manner and fewer of them are shown than actually existed.

In the optical circuit 500, the directions of propagation of light can be varied when ten different wavelengths of signal light are superposed and outputted, so that the width of the circuit can be greatly reduced, to 5 mm in the example. Thus, the size of the optical communication device can be reduced. The projections 406 can be formed by the pressing of a mold, manufacturing cost can be reduced. While the present example relates to a device in which input light is superposed, it should be obvious that the optical waveguide 503 can be usefully applied to all optical devices for controlling an optical path.

By applying the present invention to optical waveguides, the direction of propagation of light can be varied by causing a signal light to propagate in a structure where projections made of an organic material as a principal component are arranged at periodical intervals. The projections can be formed by a simple manufacturing technique involving the pressing of a mold, such that an optical device can be manufactured at low cost.

In accordance with the invention, a release mechanism is provided in a nanoprint mold by, in particular, increasing the thickness of a center portion of the mold. By so doing, the substrate is warped during the pressing step and then tries to regain its original state as the mold is released in the release step, creating a stress causing the substrate and mold to separate from each other. Thus, the release of the mold from the substrate is facilitated at a point where the stress exists. Further, in accordance with the invention, a flexible mold is employed such that the damage to the substrate and/or the mold can be prevented which could result if a local stress is applied between them during the releasing of the mold. In accordance with the invention, additionally, a spring mechanism is provided between the mold and the substrate whereby the release of the mold from the substrate is facilitated during the release step.

What is claimed is:

1. A nanoprinting mold for forming a fine structure on a resin substrate or on a resin film on a substrate using a press machine, wherein said mold has a concave-convex pattern including a plurality of concave portions and convex portions, and a mold-releasing agent is provided only on top surfaces of said convex portions of said mold, and wherein said mold-releasing agent is a solid and has a coefficient of friction smaller than that of said concave portions.

2. The nanoprinting mold according to claim 1, wherein said mold-releasing agent provides a mold-releasing layer only on said top surfaces of said convex portions of said mold, whereby said mold includes said mold-releasing layer only on said top surfaces of said convex portions.

3. The nanoprinting mold according to claim 2, wherein said mold-releasing layer has a thickness smaller than a pattern depth of said mold.

4. The nanoprinting mold according to claim 2, wherein said mold-releasing layer is a diamond-like carbon layer only on said top surfaces of said convex portions of said mold.

5. The nanoprinting mold according to claim 1, wherein the mold is made of a material selected from the group consisting of Si, SiC, SiN, polycrystalline Si, glass, Ni, Cr, Cu, and combinations thereof.

6. The nanoprinting mold according to claim 1, wherein said mold-releasing agent is provided such that in removing the mold from resin which forms said fine structure, projections of said resin are elongated as compared to a depth of concave portions of the mold.

7. The nanoprinting mold according to claim 1, wherein said mold-releasing agent is an agent provided by a chemical vapor deposition process.

8. The nanoprinting mold according to claim 7, wherein said chemical vapor deposition process is a plasma chemical vapor deposition process.

* * * * *